HIGH FREQUENCY TRANSISTOR OSCILLATOR

Filed May 25, 1955 3 Sheets-Sheet 1

*INVENTOR.*
RICHARD F. RUTZ
*BY*
Alvin J. Riddles
AGENT

July 8, 1958 R. F. RUTZ 2,842,668

HIGH FREQUENCY TRANSISTOR OSCILLATOR

Filed May 25, 1955 3 Sheets-Sheet 2

INVENTOR.
RICHARD F. RUTZ

BY Alvin J. Riddles

AGENT

July 8, 1958 R. F. RUTZ 2,842,668

HIGH FREQUENCY TRANSISTOR OSCILLATOR

Filed May 25, 1955 3 Sheets-Sheet 3

*INVENTOR.*
RICHARD F. RUTZ

*BY*

Alvin J. Riddles

AGENT

United States Patent Office 2,842,668

Patented July 8, 1958

2,842,668

HIGH FREQUENCY TRANSISTOR OSCILLATOR

Richard F. Rutz, Fishkill, N. Y., assignor to International Business Machines Corporation, New York, N. Y., a corporation of New York Application May 25, 1955, Serial No. 511,069

7 Claims. (Cl. 250—36)

This invention relates to transistor circuit elements and more particularly to a transistor structural principle that permits high frequency operation.

In the operation of a transistor circuit element in high frequency applications a phenomenon known as minority carrier storage has the effect of limiting the frequency response. Heretofore, the design of transistor circuit elements for high frequency operation, in order to overcome this carrier storage problem, has resulted in transistors being fabricated using extremely small volume semi-conductor crystals and the electrode spacings on the crystals have been held to close tolerances. This type of construction has resulted in a deterioration of other equally valuble characteristics such as high voltage and current carrying capacity and further, has increased the complexity of fabrication of these devices.

Briefly what has been discovered is a transistor structural principle that utilizes a broad area P–N junction in combination with an electric field set up in the crystal itself associated with currents flowing in it which controls the emission region of a broad area junction and influences the rate and direction of carrier flow inside the crystal so that high frequency operation, high amplification and high power handling are possible in a single device that is manufactured under tolerances that are normal practice in the art.

Accordingly, a primary object of this invention is to provide a transistor structure that utilizes an internal electric field to direct the rate and direction of carrier flow inside the semi-conductor crystal.

Another object is to provide a single transistor structure that is capable of high frequency operation, high amplification and high current handling.

Still another object is to provide a single transistor structure capable of high frequency operation, high amplification and high current handling that is made using standard fabricating techniques.

A related object is to provide a circuit for use with this improved transistor to provide a strong electric field for high power operation.

Still another related object is to provide an improved high frequency stable transistor oscillator.

Other objects of the invention will be pointed out in the following description and claims and illustrated in the accompanying drawings, which disclose, by way of example, the principle of the invention and the best mode, which has been contemplated, of applying that principle.

Figure 1:
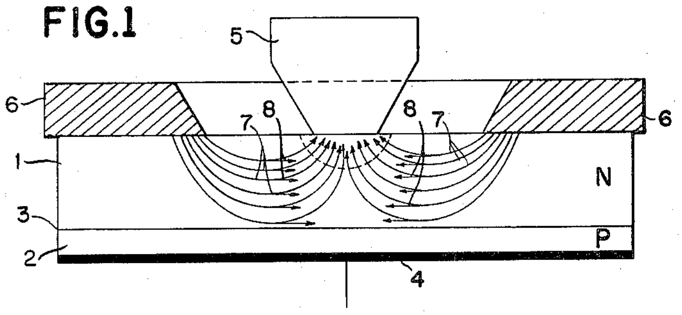
Figure 1 shows the electric field produced by the structural principle of this invention.

Referring now to Figure 1 there is shown a transistor employing an embodiment of the structural principle of this invention and illustrating the manner of operation. The transistor of Figure 1 comprises a semi-conductor crystal having a region of one type conductivity 1 and a region of opposite type conductivity 2 separated by a junction barrier 3. The thickness of the region 1 is controlled so as to be near or preferably less than the diffusion distance for the average minority carrier during the carrier lifetime of the semi-conductor material. The thickness of the region 2 is sufficiently thin so that in the presence of an ohmic contact 4 applied to most of the exposed surface, the region 2 is essentially equi-potential throughout. Also the resistivity of the region 2 should preferably be much lower than that of the region 1 for good injection efficiency and carrier direction. An electroformed point conductor 5 is provided making contact with the region 1 on the face opposite to the ohmic connection 4 and a circular connection 6 is provided making ohmic contact with the region 1 on the same face and near to the point contact 5. In the above described transistor structure in order to illustrate the structural principle of this invention it is intended that the region 2 serve the function of an emitting junction, that the electroformed point contact 5 serve the function of a collector having an intrinsic amplification factor greater than $1+b$ in which $b$ is the ratio of majority to minority carrier mobilities in the N region 1 and that the ohmic connection 6 serve the function of a base.

The method of operation is as follows, assuming region 1 to be N type conductivity and region 2 to be P type. The collector 5 is an electroformed point such that it has an intrinstic amplification factor greater than $1+b$ as a result of which, for each hole that arrives at the collector 5 from the junction 3 more than $b$ additional electrons are liberated which flow to the base 6. The base 6 in this embodiment is a circular electrode concentric with the collector 5 and with this construction the flow of electrons from the collector 5 to the base 6 when holes injected at the emitter junction 3 arrive at the collector 5 enhances the axially symmetric electric field in the crystal 1 around the collector 5. We need an intrinsic alpha greater than $1+b$ to insure inhancement of the electric field as hole current is increased, since conductivity modulation alone tends to overcome the electron current by a factor of $b$. This electric field has an inward horizontal component which tends to direct and accelerate holes injected at the emitter junction 3 toward the collector 5. Also as a result of the electric field, the emitter junction 3 is biased more in the direction of easy current flow directly under the collector point than at more distant points and hence the emission of holes tends to be confined and restricted to the region beneath the collector. In Figure 1 the current flow due to electrons is illustrated symbolically as arrows 7 in the crystal 1 from the base 6 to the collector 5 and the horizontal components of the electric field which are tangent to and in the same direction as the lines of current flow 7 due to electrons at each point in the crystal 1 are similarly symbolically illustrated as arrows 8.

Figure 2:
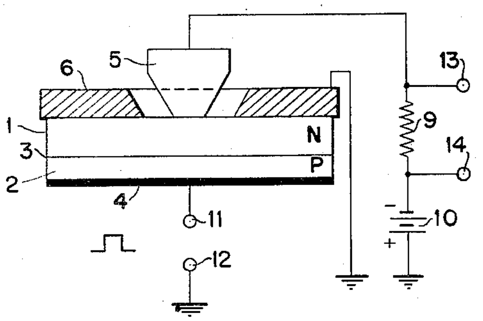
Figure 2 is a circuit to illustrate pulse type operation.

A further illustration of this electric field may be observed in connection with the circuit of Figure 2 wherein the transistor of Figure 1 is connected with the base 6 connected to ground, the collector 5 is connected through a suitable load impedance 9 to a negative source of potential shown as battery 10. Signal input terminals 11 and 12 are provided to introduce positive signals to the emitter and output terminals 13 and 14 are provided to deliver an output signal developed across the load impedance 9. Under these circuit conditions when a positive input signal is introduced at terminals 11 and 12 the P region 2 is driven positive with respect to the N region 1 and holes are injected at the junction emitter barrier 3. These holes diffuse to the collector 5 and due to the intrinsic alpha of the collector 5 electron current flows to the base 6 along lines shown symbolically in Figure 1 as arrows 7. Associated with this electron current is an electric field or potential gradient in the crystal such that the potential varies from negative at the collector 5 to ground at the base 6. This electric field has the proper direction to direct and accelerate the positively charged holes toward the negative collector 5. The field vectors shown symbolically in Figure 1 as arrows 8, are tangent to and in the same direction as the lines of electron current flow and are indicative of the direction of the forces applied to the positively charged holes by the electric field. Since in this embodiment the collector is in the center of a hole in the base tab it may be seen that the holes injected anywhere at the barrier 3 will tend to be directed and accelerated by the electric field toward the center of symmetry of the transistor where the collector 5 is located. It is true that at large distances the electric field will be weak. However, the great majority of holes will be emitted directly under the collector point as we have shown. To repeat this then, the electric field under the point is greatly strengthened as larger quantities of holes arrive at the collector 5. This biases a restricted region of the large junction barrier 3 much further in the direction of easy current flow so that essentially all of the injected holes will emanate from this small region directly under the collector 5. Thus it is to be noted here that one of the major effects achieved by the structural principle of this invention is that a physically large junction emitter has been made electrically small by virtue of the electric field set up in the crystal by arrangement of the electrodes so as to cause the electron current in the crystal to set up an electric field which in turn confines the area of injection of holes and directs and accelerates the injected holes inside the crystal toward the collector.

Continuing further it may now be seen from the above description that once a sufficient number of emitted holes are collected, the action of the field and the increased hole concentration caused by it, together produce an internal positive feedback condition, which proceeds until the internal forward resistance of the transistor is very low, and the current in the collector circuit approaches a value limited essentially by the impedance in the collector circuit. Even though the externally supplied emitter current is insufficient to drive the collector into saturation, sufficient extra current to accomplish this for a short time will in general be supplied by associated emitter capacitances, to be described in detail below. Under these collector current conditions the potential level of the P region 2 reaches a point near the potential level of the collector 5 which point is negative with respect to ground. Since all junction barriers in semi-conductor crystals and all external leads, however short, have a certain amount of capacitance associated with them, the potential level of the P region 2 going negative with respect to ground so charges this capacitance that at the end of the input signal the P region 2 is prevented from rising immediately to the off signal potential level. Hence, at the end of the pulse applied at terminals 11 and 12 in Figure 2 the potential level of the P region 2 is held momentarily, by the charge on the lumped capacitive effect of the barrier 3 and the external leads, at a valve negative with respect to ground. This gives a considerable advantage because it produces a second point of collection so to speak for the positively stored holes in the N region 1. In ordinary construction, at the end of pulse time, holes stored in the crystal continue to arrive at the collector preventing the current in the collector circuit from returning to the off level. This may continue for as long as the carrier lifetime of the material which under sufficiently high frequency operation may be a substantial part of the pulse repetition rate. Under the conditions as described above the hole storage situation is sharply improved. Since at the end of pulse time both the collector 5 and the emitter junction 3 are negative with respect to the positively charged holes, these stored holes have two points of collection that are closely adjacent. The N region 1 being of a thickness near the diffusion distance of the carriers during the carrier lifetime of the material, the provision of two points of collection for the stored holes separated only by this distance, would reduce the hole storage time to an appreciable fraction, as high as half of the carrier lifetime at a maximum. Other factors contributing to rapid pulse recovery time are the following: (*a*) The stored holes are acted upon by the forces of a sweeping field momentarily set up in the crystal by virtue of the fact that both points of collection are negative with respect to the positively charged crystal; (*b*) the electric field although collapsing applies some force to the holes near the collector; (*c*) due to the close proximity of the electrons producing the electric field a large amount of recombination between holes and electrons takes a place; (*d*) only the holes arriving at the collector 5 affect the pulse recovery time, the holes arriving at the junction 3 merely serve to help neutralize the charge on the lumped capacitance of the junction and external leads; (*e*) and still another factor is the close proximity of the ohmic base connection which also acts as a recombination sink for holes.

Figure 3:
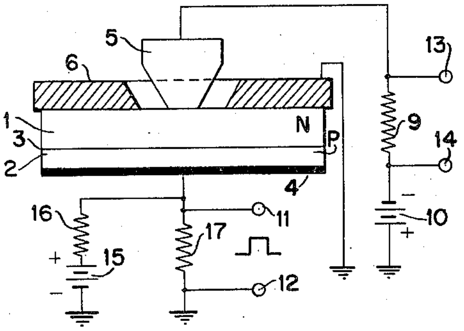
Figure 3 is a circuit to illustrate an external forward current source.

It will be apparent that an improvement in rise time can be realized by setting up the electric field inside the crystal prior to introducing an input signal. The major advantage of this arrangement will be that the time required for the holes injected into the crystal at the beginning of the input signal to traverse through the N region to the collector 5 and set up the electric field, will be sharply reduced. If the electric field is already set up in the N region 1, all holes injected due to the input signal will be immediately directed and accelerated toward the collector. One method of setting up this electric field is to provide a small steady state current through the transistor that sets up the electric field. However, it is to be noted at this point that, as was pointed out above, as carriers arrive at the collector, the internal positive feedback action so reduces the forward resistance through the transistor that the emitter actually goes negative, approaching the collector potential for increased values of positive current. This is in effect a negative resistance at the emitter so that in the setting up of the electric field in the crystal it is necessary that the steady state current through the transistor be held to a value sufficiently small so that while the electric field is set up in the crystal it is of sufficiently small intensity that the internal positive feedback action is prevented from being initiated by the internal losses in the transistor. The point at which the forward current is sufficient to initiate the internal positive feedback action is best described as the point at which the emitter begins to go further negative as increments of positive emitter current are introduced. A typical circuit for providing this steady state current is shown in Figure 3 wherein the circuit of Figure 2 is modified by the addition of a positive source of potential 15 and resistor 16 in series between ground and terminal 4 to provide a steady state constant forward current through the transistor. An input impedance 17 is provided between terminal 4 and ground and positive input signals are introduced between input terminals 11 and 12 across this impedance 17. In this circuit the values of potential source 15 and impedance 16 are so chosen as to provide a constant forward current through the transistor sufficient to set up the electric field in the N region 1.

Figure 4:
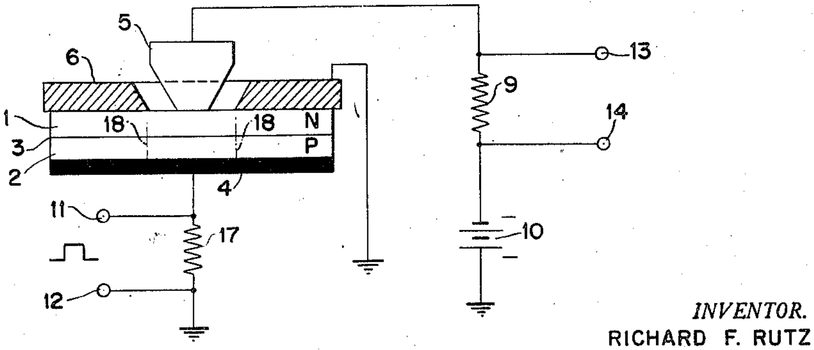
Figure 4 is a circuit to illustrate the self biasing action.

An alternate method of providing the initial steady state forward current sufficient to set up the electric field in the crystal is to employ the effects of a self-biasing structural principle described and claimed in my copending application, Serial Number 458,619, filed September 27, 1954. This principle provides two current paths from base to collector, one directly from base to collector through the crystal and a second, having a lower impedance than the first, from the base to a unipotential junction emitter and thence from this junction emitter to the collector so that as a result of these currents a potential gradient is set up in the crystal that biases a portion of the junction emitter in the forward direction and provides a self bias on the emitter equivalent to the impedance drop from base to emitter. This self biasing action is described in detail in the above referred to application nad its use in providing a steady state current may be seen in connection with Figure 4 wherein the spacing from the base 6 to the collector 5 has been increased to provide the self biasing action and an input impedance 17 is introduced between the P region 2 and ground to permit the P region 2 to assume a negative potential level with respect to ground. Under these transistor structure conditions two current paths are provided from the base 6 to the collector 5. The first of these paths is directly from base 6 to collector 5 through the N region 1 so that a potential gradient is set up from ground at the base 6 to negative at the collector 5. The second path is from the base 6 through the N region 1 and the junction barrier 3 to the unipotential P region 2 and thence from the unipotential P region 2 back through the junction barrier 3 to the collector 5. Since the base 6 to collector 5 spacing has been increased while the thickness of the N region 1 remains the same, namely at or near the diffusion distance for the average carrier during the carrier lifetime of the semiconductor material, this path is of lower impedance than the first path and the unipotential P region 2 will be at a potential level between the base 6 and the collector 5, that is it will be negative with respect to the base 6 but positive with respect to the collector 5. Thus there will be set up in the crystal in this embodiment a circular line of unipotential corresponding to the point in the potential gradient between the base 6 and the collector 5 that is equivalent to the potential level assumed by the unipotential P region 2. This circular line of unipotential is shown in Figure 4 in a symbolic location as points 18, along the junction barrier 3. Since the P region 2 is unipotential the barrier 3 will be reverse biased between line 18 and base 6 and forward biased between line 18 and the collector 5. Hence, by constructing the transistor according to this structural principle, a forward steady state current through the transistor that sets up the electric field in the N type region 1 is provided.

Figure 5:
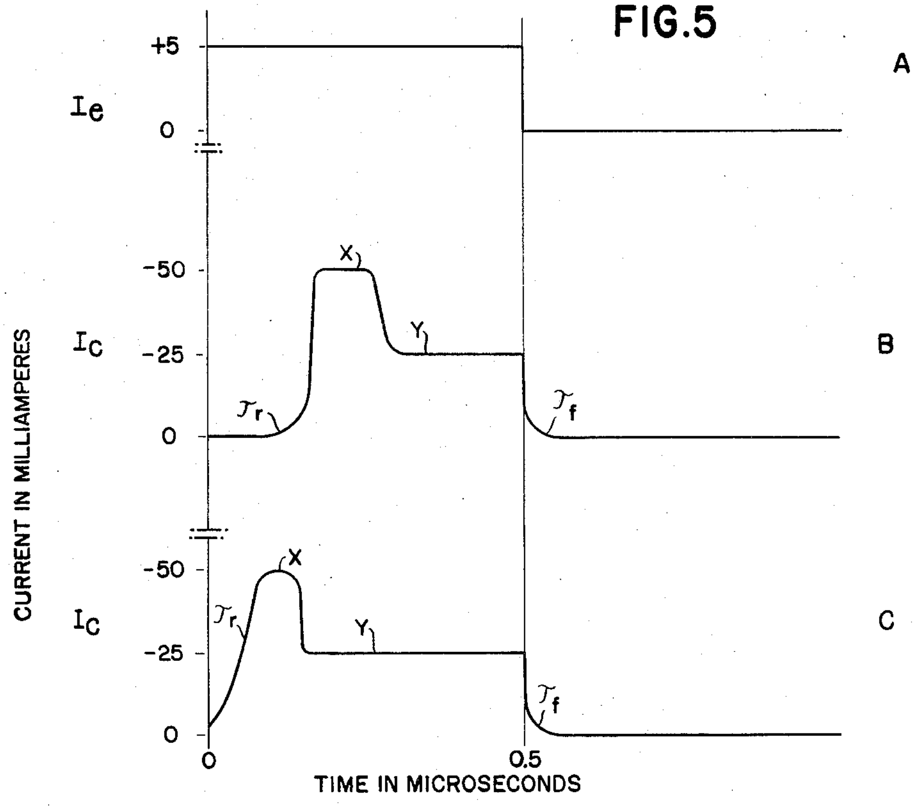
Figure 5 is a curve of collector and emitter current variation with time.

The effect of the structural principle of this invention on the output signal of a junction emitter, point contact collector transistor is shown in Figure 5 wherein curve A represents the emitter input signal, curve B represents the collector current of a transistor embodying the structural principle of this invention and curve C represents the collector current of a transistor embodying the structural principle of this invention and provided with a steady state forward current setting up the electric field in the crystal. Referring now to Figure 5 curve A represents emitter current pulse of one-half microsecond duration.

In curve B representing a transistor embodying the structural principle of this invention there is an initial delay while the carriers diffuse across the base but as soon as the first carriers arrive at the collector the internal positive feedback action quickly sets up the electric field which sweeps the diffusing carriers to the collector and causes the current to rise in a much shorter time than would have been for a straight diffusion process. This time is labelled *tr*. Associated with this current rise is a surge of current to point X before the current arrives at the conducting steady state labelled Y. This surge is produced partly as a result of the capacitance described above due to the capacitance associated with the junction barrier and the external leads and this surge is also partly produced by the action of the electric field established suddenly by the internal positive feedback action in sweeping many carriers, diffusing through the crystal, to the collector. This surge has useful aspects that will be described in detail later. At the end of pulse time the current drops sharply due to the two points of collection and a third point for recombination, namely the closely adjacent base, for the holes resulting in a very short fall time labelled *tf*. This fall time in the past has been as long as the carrier lifetime of the material.

In curve C as a result of the steady state forward current the electric field is already set up in the crystal. As a result the very first carriers injected are directed and accelerated by the electric field so that rise time *tr* is even more sharply reduced since even less time is taken up by the carriers in transversing the distance from emitter to collector and setting up the internal positive feedback. Hence, the current rises through a considerably shortened time *tr* to point X and thence to point Y and then at the end of pulse time current falls through the time *tf* to the steady state value.

From a comparison of curves B and C, it is to be noted that a transistor embodying the structural principle of this invention respons to input pulses more quickly both in rise and recovery times and in addition a current surge as the collector current rises is acquired which may be used for high frequency oscillator purposes to be later described.

Since the rise time *tr* is primarily a function of the diffusion of the carriers across the crystal from emitter to collector it is to be noted that by variation of base thickness and sweeping field due to collector potential, a transistor circuit embodying the structural principle of this invention can readily be fabricated by one skilled in the art that will respond to a sharp emitter current input pulse of less duration than *tr* by delivering a sharp output pulse at a later time and with considerable gain.

Figure 6:
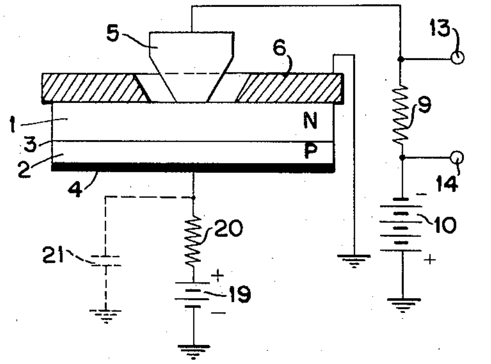
Figure 6 is a circuit of an oscillator employing the structural principle of this invention.
Figure 7:
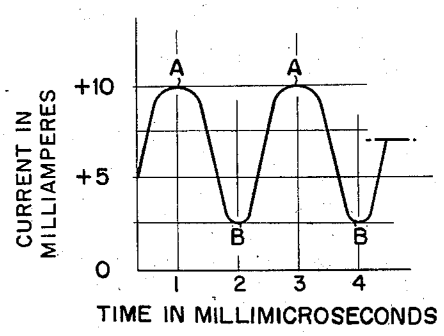
Figure 7 is the collector current curve of the circuit of Figure 6.

The current surge shown as point X of curves B and C in Figure 5 may be employed to great advantage in providing the time basis for a highly reliable high frequency oscillator. This oscillator may be understood more readily in connection with Figure 6 which shows the transistor described thus far as illustrating an embodiment of the structural principle of this invention connected to provide a high frequency oscillator. Referring now to Figure 6, a steady state forward current through the transistor is provided by the combination of potential source 19 and resistor 20 connected between the emitter connection 4 and ground. The capacitance associated with the junction 3 and external leads has been shown lumped into a single symbolic capacitor shown dotted as element 21. In operation the forward current through the transistor is at a value that is sufficient to initiate the internal positive feedback action but is less than the current saturation value. The forward current rises sharply as the internal positive feedback action strengthens the electric field and the combination of the discharge of the lumped capacitance 21 and the holes swept out of the crystal by the suddenly strengthened field produce a current surge. At the peak of this surge, shown as point X in curves B and C of Figures 5, the P type emitter region 2 has gone negative with respect to the N type region 1 so that when the charge on the lumped capacitance 21 is exhausted the effect of this capacitance is to hold the P region 2 at this negative value until the forward current from the potential source 19 can recharge the capacitance 21 through registor 20. After the charge on the capacitor 21 is exhausted at the peak of the current surge and the N region 1 reestablishes its steady state potential level and with the capacitance 21 holding the P region 2 negative the barrier 3 is reverse biased and the collector current drops. The collector current will stay down until the potential source 19 can recharge the capacitance 21 through resistor 20. It should be noted at this point that the time constant of the RC network of resistor 20 and capacitor 21 controls the frequency of oscillation and proper selection of the value of resistor 20 by one skilled in the art will give some control of the frequency of oscillation. A wider range of frequency control may be exercised by one skilled in the art by construction of the transistor and leads so as to permit control of both resistor 20 and capacitor 21. In Figure 7 there is shown a curve of the collector current through resistor 9 of the oscillator in Figure 6, wherein the initial steady state current through the transistor is at a value arbitrarily shown as the value of Ic at 0 time. Referring now to both Figures 6 and 7, the current rises as the capacitance 21 of Figure 6 discharges until a peak at point A is reached. At this point the capacitance 21 is discharged and cannot sustain the heavy current. Also due to the internal positive feedback action in lowering the forward resistance through the crystal the capacitor 21 now has a charge on it that tends to hold the P region 2 at the negative value of potential it has assumed under the heavy current flow. Holding the P region 2 at this negative value and not being able to sustain the high current value at point A in Figure 7 causes the current through the transistor to be cut off. Since the P region 2 is negative with respect to the N region 1, the barrier 3 is reverse biased. When thus cut off the collector current drops sharply as the carriers are cleaned up; meanwhile the potential source 19 is now charging the capacitance 21 through resistor 20 and when the capacitance 21 is charged so that it no longer holds the P region 2 negative, forward current through the transistor is again supplied by the potential source 19. The collector current stops dropping at this time, shown in Figure 7 at point B, and the forward current through the transistor reinitiates the oscillation cycle of current swing shown as subsequent points A and B.

The oscillator thus described employs a combination of the lumped capacitances and an internal electric field in a junction emitter transistor to produce an oscillator with very few components and having extremely high oscillating frequencies at good power output. This oscillator, because its time base is directly associated with the parameters of the semi-conductor device of which it is made, is highly reliable and physically rugged.

The structural principle of this invention provides a means of using the geometry of the electrodes applied to the crystal of a transistor to take advantage of base region sweeping fields. This is accomplished by providing contact arrangements such that the flow of majority carriers from collector to base produces an electric field in the crystal, which, by the structural geometry of the transistor, is brought sufficiently near to the emitter to accelerate and direct minority carriers to the collector; and at the same time this electric field by its influence introduces the additional advantages of reducing the minority carrier storage time and causing a negative resistance region in the emitter characteristic such that the emitter potential becomes negative at high currents and is kept negative after the end of the applied input pulse, serving thereby as an additional point of collection for minority carriers. Hence, it has been found that there is a certain range of distances between emitter, base and collector electrodes in transistors that will permit the structural principle to be employed. This range of distances is affected by the carrier lifetime of the semi-conductor material, the resistivity of the semi-conductor material and by the collector potential applied to the transistor. The range of distances as a minimum is governed by the requirement that the emitter to collector spacing be separated on the semiconductor crystal by sufficient distance that "punch through" due to the collector potential applied to the transistor, does not affect the transistor characteristics. "Punch through" is defined in the art as the extension of the depletion region associated with a reverse biased junction (as is found under an electroformed point or P–N Hook collector) through the crystal until it influences the injection of carriers by the emitter. An upper limit on electrode spacing between emitter and collector in order that the internal positive feedback may exist is in the vicinity of the diffusion distance of the average excess carrier during the carrier lifetime. Excess carriers are defined as the carriers in excess of the equilibrium of majority and minority carriers. This is true because otherwise the internal losses in the crystal, such as recombination, are so great that the concentration of minority carriers sufficient to produce this feedback condition cannot be developed. The following is an example of field strength necessary to produce the internal positive feedback for the electrode arrangement of Figure 1.

In order to obtain positive feedback action in a semiconductor having an electrode arrangement as shown in Figure 1 it is necessary that there be good electric field focusing, that is, there must be produced an electric field that restricts emission to a small region of a broad area emitter. For each point in the N region very close to the emitting region in the semi-conductor crystal spaced from the collector a distance "*d*" equal to either the distance from the collector to the base or the distance between the emitter and the base, whichever is smaller, it is sufficient that the electric field at the point be .1 volt per distance "*d*" from the collector in order to obtain adequate focusing for internal feedback action.

Several devices embodying this structural principle have worked well when the emitter to collector spacing was within the diffusion distance for the average excess carrier during the excess carrier lifetime of the semi-conductor material and the point contact collector made contact with the N region in an aperture in the base contact having a diameter within five times the diffusion distance for the average excess carrier during the carrier lifetime of the semi-conductor material. In order to insure the internal positive feedback action without requiring unduly high gain from the collector, the injection efficiency of the emitter should be close to unity, such as can be achieved with a junction emitter.

Having an understanding of the manner of operation of the structural principle of this invention it may be observed that this principle can be applied to other varieties of transistor structures. Some illustrative examples of transistor structures embodying this principle are shown in Figures 8, 9, 10, 11 and 12.

Figure 8:
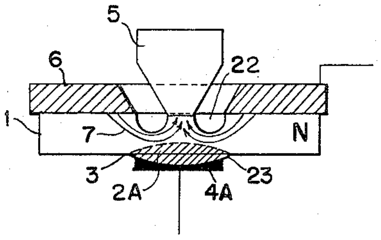
Figure 8 is a diffused or alloy junction emitter, point contact collector, etched body transistor embodying the principle of this invention.

Referring now to Figure 8, the transistor of Figure 1 is shown having the N region 1 between the base 6 and the collector 5 partially removed in the region 22 to direct the lines of electron current flow 8 from base 6 to collector 5 nearer to the emitter junction 3. The P region 2A is shown constructed by alloying or diffusing into the N type region 1 an appropriate impurity 23 to which an ohmic contact 4A is made.

Figure 9:
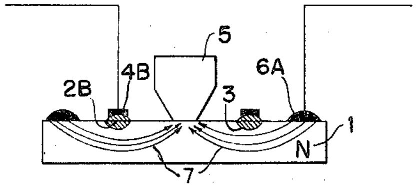
Figure 9 is a transistor with all electrodes on the same side of the body embodying the principle of this invention.

The construction of Figure 9 employs an electroformed point contact collector 5 having a circular concentric diffused or alloyed emitter 2B surrounding the collector 5 and provided with an ohmic contact 4B. A circular ohmic base contact 6A is provided concentric with both emitter and collector. Since all electrodes are applied to the same side of the N type region 1, the field associated with the majority carrier flow lines 7 tends to restrict the minority carrier injection and flow to the portion of the crystal in the immediate vicinity of the collector. With this geometry the thickness and size of the crystal is rendered unimportant; however, the spacing from emitter to collector should be preferably less than the diffusion distance in the carrier lifetime.

Figure 10:
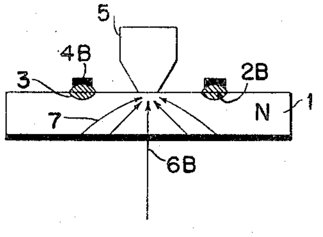
Figure 10 is a transistor having the emitter around the collector and opposite to the base embodying the principle of this invention.

In Figure 10 an emitter 2B and collector 5 as in Figure 9 are concentric and on the same side of the N region 1 and the ohmic base 6B is applied to the opposite side. Here the majority carrier flow lines 7 from base 6B to collector 5 act to restrict the area of emission and minority carrier flow to the region of the crystal immediately adjacent to the emitter and collector. In this geometry the thickness of the N region 1 is not critical but the emitter to collector spacing requirement should be maintained.

Figure 11:
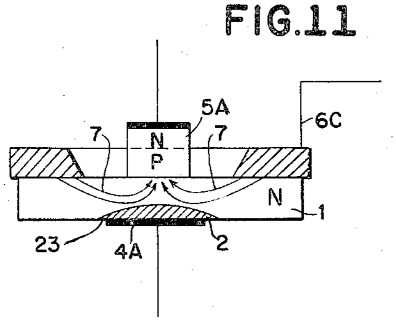
Figure 11 is a diffused or alloy junction emitter, P–N hook collector transistor embodying the principle of this invention.

Figure 11 shows a transistor employing the structural principle of this invention having a PN hook collector 5A which may be made by grinding away unwanted portions of a standard NPN transistor, diffusing or alloying in a junction emitter region 2 by using an appropriate impurity 23 and making an ohmic base connection 6C to the N region 1. Here it is necessary to control the distance of the N region between emitter and collector to the required value described above. The lines of majority current flow are shown as elements 7.

Figure 12:
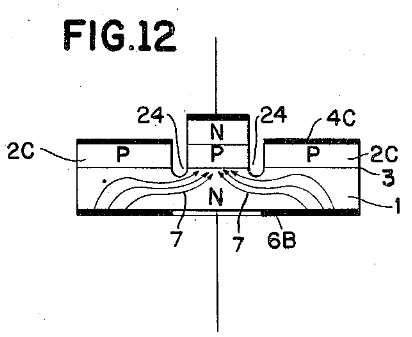
Figure 12 is a circular junction emitter, P–N hook collector transistor embodying the principle of this invention.

In Figure 12 there is shown a transistor electrode geometry similar to Figure 10 which may be made by cutting up a standard NPN transistor to form a PN hook collector 5 having a junction emitter region 2C adjacent to it. The slot 24 should be sufficiently thin that the required emitter to collector spacing is maintained. The lines of majority carrier flow are indicated as 7.

As may be seen from the illustrative examples shown in the above structures the structural embodiment of this invention may be applied to a wide variety of transistor electrode geometries. All structures, however, have in common a broad area P–N junction serving as an emitter, a high intrinsic alpha (greater than $1+b$) collector and an ohmic base connection in spatial relationship such that the majority carrier current flow from base to collector produces an electric field in the crystal that serves to accelerate and direct minority carriers injected by the emitter toward the collector, so concentrating these carriers in the crystal in one region that the forward resistance of the transistor is reduced at this region and the minority carrier injection of the broad area junction is thereby electrically restricted to a small area.

While this structural principle can be carried out by anyone skilled in the art, in order to facilitate practicing this invention the following details are here listed for the transistor of Figure 1 connected in the circuit of Figure 3. These are included as illustrative material only and should not be construed as limiting values.

| | |
|---|---|
| Thickness of N type region | .001 inch. |
| Thickness of P type region | .0001 inch. |
| Crystal length | .020 inch. |
| Crystal width | .020 inch. |
| Collector-Phosphor bronze wire | .005 inch diameter. |
| Intrinsic $a$ of collector | 5. |
| Hole in base connection | .003 inch diameter. |
| Collector point in contact with N type region | .00025 inch diameter. |
| N type region | 15 ohm centimeters resistivity germanium. |
| P type region | .1 ohm centimeter resistivity germanium. |
| Battery **10** | 45 volts. |
| Battery **15** | 20 volts. |
| Resistor **9** | 500 ohms. |
| Resistor **17** | 10,000 ohms. |
| Resistor **16** | 20,000 ohms. |
| Input signal pulse | 5 milliamperes—50 millimicrosecond duration. |
| Output signal pulse | 50 milliamperes — approximately 60 millimircosecond duration. |
| Steady state forward current through transistor | 1 milliampere. |

Under the conditions as listed above the strength of the electric field in the crystal may be determined fairly accurately from the following expression.

$$E_{(a)}=\frac{Ic}{2\pi a^2}P_0\left(1-\frac{1+b}{a^*}\right)$$

where:

$a$ * is the intrinsic $a$ of the electroformed collector=5.

$b$ is the mobility ratio of the carriers, the accepted value for germanium being=2.

$P_0$ is the resistivity of the N type region=15 ohm centimeters.

$I_c$ is the collector current-selected during the rise time at an arbitrary value of 20 milliamperes.

$a$— is the radius from the collector of the point at which the field strength is being calculated=.0004 inch.

E is the field strength in volts per centimeter.

$$E_{(.0004)}=\frac{.02}{2\pi(.001016)^2}15\left(1-\frac{1+2}{5}\right)$$

i. e.

E at .0004 inch from the collector is approx.=19,400 v./cm.

The above calculation is approximate due to the assumption that diffusion currents in the crystal may be neglected, and that the geometry of the electroformed region under the collector and the emitter region are hemispherical.

While there have been shown, described and pointed out the fundamental novel features of the invention as applied to an illustrative embodiment it will be understood that various omissions, changes and substitutions and changes in form and details of the structures utilized may be made without departing from the spirit of the invention. For example, the interchanging of N and P type materials, the use of gold bonded, electroformed point contacts and P–N hook type collectors interchangeably and the formation of diffused, alloyed or grown junction emitters all may readily be done by one skilled in the art. It is the intention therefore to be limited only by the scope of the following claims.

What is claimed is:

1. A semi-conductor device including, in combination, a semi-conductor body, a junction emitter connection to said semi-conductor body, a high amplification factor collector connection to said semi-conductor body, the spacing from said emitter to said collector on said semi-conductor body being within the average diffusion distance of the excess carriers during the excess carrier lifetime of the material of said semi-conductor body, means for controlling minority carrier flow in said semi-conductor body between said emitter and collector comprising base electrode means affixed on said semi-conductor body in a region disinct from said emitter and said collector and positioned to produce an internal field therebetween in said semi-conductor body produced by majority carrier currents from said base to said collector operable to restrict minority carrier injection to a selected portion of said emitter and to accelerate and direct said minority carriers to said collector.

2. A semi-conductor device comprising, in combination, a semi-conductor crystal, junction emitter electrode means in contact with said semi-conductor crystal, high amplification factor collector electrode means in contact with said semi-conductor crystal and spaced from said emitter a distance not greater than the average diffusion length of the excess carriers during the carrier lifetime of the semi-conductor crystal, and ohmic base electrode means in contact with said crystal, each of said electrode means being so positioned with respect to one another on said crystal that an internal electric field is provided therebetween focusing the flow of minority carriers injected into said crystal by said emitter toward said collector.

3. An oscillator comprising a transistor including a semi-conductor body, a junction emitter connection, a high amplification factor collector connection in spatial relationship on said semi-conductor body said emitter and collector being within the diffusion distance of the excess carriers during the carrier lifetime of the material, means comprising base electrode means on said semiconductor body so located that an electric field in said semi-conductor body produced by majority carrier current flow from said base to said collector is operable to restrict minority carrier injection to a selected region of said emitter and to accelerate and direct said minority carriers to said collector, a point of reference potential, a first potential source, means connecting the negative terminal of said first potential source to said point of common reference potential, a first resistor, means connecting a first terminal of said resistor to the positive terminal of said source of potential, means connecting the remaining terminal of said first resistor to said emitter connection, a second resistor having one terminal connected to said collector connection, a second source of potential having its negative terminal connected to the remaining terminal of said second resistor, means connecting the positive terminal of said second source of potential to said point of reference potential, and means connecting said base connection to said point of reference potential.

4. A transistor comprising a body of one type conductivity semi-conductor material, a junction emitter connection on said body including a region of opposite type conductivity semi-conductor material forming a junction barrier with said body, a high amplification factor collector connection on said body and spaced from said emitter region by a distance within the average diffusion distance of the excess carriers during the carrier lifetime of the semi-conductor material of said body, and an ohmic base connection affixed to said body spaced from and at least partially surrounding said collector.

5. A transistor comprising a body of one type semi-conductor material, a junction emitter connection on said body including a region of opposite type conductivity semi-conducting material forming a junction barrier with said body, an ohmic base connection on said body and spaced from said emitter by a distance within the average diffusion distance of the excess carriers during the carrier lifetime of the semi-conductor material, an aperture in said base connection, said aperture being substantially circular and having a diameter within five times the average diffusion distance for the excess carriers during the carrier lifetime of the semi-conductor body, and an electroformed point contact collector connection making contact with said body in said aperture.

6. A transistor comprising a semi-conductor body, a high amplification factor collector contact on a first surface of said body, a junction emitter contact on said first surface of said body at least partially surrounding said collector and spaced from said collector connection a distance less than the average diffusion distance for the excess carriers during the carrier lifetime of said semi-conductor body, and a circular ohmic base connection surrounding and spaced from said emitter and on said first surface of said body.

7. A transistor comprising a body of one type semi-conductor material, a junction emitter connection on said body including a region of opposite type conductivity semi-conducting material forming a junction barrier with said body, an ohmic base connection on said body and spaced from said emitter by a distance within the average diffusion distance of the excess carriers during the carrier lifetime of the semi-conductor material, an aperture in said base connection, said aperture being substantially circular and having a diameter within five times the average diffusion distance for the excess carriers during the carrier lifetime of the semi-conductor body and a high amplification factor collector connection making contact with said body in said aperture.

References Cited in the file of this patent

UNITED STATES PATENTS

| | | |
|---|---|---|
| 2,524,033 | Bardeen | Oct. 3, 1950 |
| 2,524,034 | Brattain et al. | Oct. 3, 1950 |
| 2,524,035 | Bardeen et al. | Oct. 3, 1950 |
| 2,672,528 | Shockley | Mar. 16, 1954 |